(12) United States Patent  
Ikeda et al.

(10) Patent No.: US 12,087,894 B2  
(45) Date of Patent: Sep. 10, 2024

(54) DISPLAY DEVICE

(71) Applicant: Japan Display Inc., Tokyo (JP)

(72) Inventors: Masanobu Ikeda, Tokyo (JP); Osamu Itou, Tokyo (JP); Yoshinori Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 429 days.

(21) Appl. No.: 17/482,701

(22) Filed: Sep. 23, 2021

(65) Prior Publication Data

US 2022/0013701 A1   Jan. 13, 2022

Related U.S. Application Data

(63) Continuation of application No. PCT/JP2020/013857, filed on Mar. 26, 2020.

(30) Foreign Application Priority Data

Mar. 29, 2019  (JP) ................. 2019-067936

(51) Int. Cl.
*H01L 33/62* (2010.01)
*H01L 27/15* (2006.01)
*H01L 33/58* (2010.01)

(52) U.S. Cl.
CPC ........... *H01L 33/62* (2013.01); *H01L 27/156* (2013.01); *H01L 33/58* (2013.01)

(58) Field of Classification Search
CPC ....... H01L 33/62; H01L 27/156; H01L 33/58; H01L 25/0753; G09F 9/30; G09F 9/33;
(Continued)

(56) References Cited

U.S. PATENT DOCUMENTS

| 8,294,154 | B2 | 10/2012 | Yamazaki et al. |
| 10,515,580 | B2 | 12/2019 | Henry et al. |
| 10,984,705 | B2 | 4/2021 | Henry et al. |
| 2006/0022969 | A1* | 2/2006 | Lee .................. G02F 1/136286 345/211 |

(Continued)

FOREIGN PATENT DOCUMENTS

| CN | 103069477 A | 4/2013 |
| CN | 109360851 A | 2/2019 |

(Continued)

OTHER PUBLICATIONS

International Search Report issued in International Patent Application No. PCT/JP2020/013857 on Jun. 23, 2020 and English translation of same. 5 pages.

(Continued)

*Primary Examiner* — Mohammad A Rahman
(74) *Attorney, Agent, or Firm* — K&L Gates LLP

(57) ABSTRACT

A display device includes a substrate, a plurality of first pixels and a plurality of second pixels provided to the substrate, a plurality of inorganic light emitting elements provided to the respective first pixels and the respective second pixels, a plurality of signal lines configured to supply a signal to the first pixels and the second pixels, and a plurality of power supply lines configured to supply a power supply potential to the first pixels and the second pixels. At least one or more of the signal lines are provided in a layer different from a layer of the power supply lines in the first pixels, and the signal lines and the power supply lines are provided in the same layer in the second pixels.

10 Claims, 9 Drawing Sheets

(58) Field of Classification Search
CPC ............ G09G 3/20; G09G 3/32; H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00
See application file for complete search history.

(56) References Cited

U.S. PATENT DOCUMENTS

| | | | |
|---|---|---|---|
| 2009/0159890 A1* | 6/2009 | Yamazaki | H10K 59/131 |
| | | | 257/E33.062 |
| 2013/0187554 A1 | 7/2013 | Ono et al. | |
| 2017/0337873 A1 | 11/2017 | Kim et al. | |
| 2018/0351035 A1* | 12/2018 | Chung | H01L 33/504 |

FOREIGN PATENT DOCUMENTS

| | | |
|---|---|---|
| JP | 2004-341513 A | 12/2004 |
| JP | 2009-169410 A | 7/2009 |
| JP | 2017-529557 A | 10/2017 |
| JP | 2018-132662 A | 8/2018 |
| JP | 2018-205741 A | 12/2018 |
| JP | 2019-045676 A | 3/2019 |
| KR | 10-2011-0029755 A | 3/2011 |

OTHER PUBLICATIONS

Written Opinion issued in International Patent Application No. PCT/JP2020/013857 on Jun. 23, 2020. 4 pages.

Office Action issued in related Chinese Patent Application No. 202080025581.8 mailed on Sep. 8, 2023 and English translation of same. 20 pages.

Office Action issued in related Japanese Patent Application No. 2019-067936 mailed on Nov. 22, 2022 and English translation of same. 9 pages.

Office Action issued in related Japanese Patent Application No. 2019-067936 mailed on Jan. 31, 2023 and English translation of same. 7 pages.

* cited by examiner

DISPLAY DEVICE

CROSS-REFERENCE TO RELATED APPLICATION

This application is a continuation of PCT International Patent Application No. PCT/JP2020/013857 filed on Mar. 26, 2020 which designates the United States, incorporated herein by reference, and which claims the benefit of priority from Japanese Patent Application No. 2019-067936 filed on Mar. 29, 2019, incorporated herein by reference.

BACKGROUND

1. Technical Field

The present disclosure relates to a display device.

2. Description of the Related Art

Displays with micro light emitting diodes (micro LEDs) serving as display elements have recently been attracting attention (refer to Japanese Translation of PCT International Application Publication No. 2017-529557 (JP-T-2017-529557), for example). A plurality of LEDs are coupled to an array substrate (or a driver backplane in JP-T-2017-529557). The array substrate includes a pixel circuit (or an electronic control circuit in JP-T-2017-529557) that drives the LED.

Red LEDs have lower luminous efficacy than that of blue and green LEDs. This tendency is noticeable especially in GaN LEDs. To address this, it is necessary to increase the drive current for red LEDs, which may possibly increase power consumption. If the emission intensity of red LEDs is increased, red light may possibly be reflected by wiring on the array substrate, thereby causing color mixture with light from other pixels. As a result, it may possibly be difficult to satisfactorily display an image.

An object of the present disclosure is to provide a display device that can prevent deterioration of display quality.

SUMMARY

A display device according to an embodiment of the present disclosure includes a substrate, a plurality of first pixels and a plurality of second pixels provided to the substrate, a plurality of inorganic light emitting elements provided to the respective first pixels and the respective second pixels, a plurality of signal lines configured to supply a signal to the first pixels and the second pixels, and a plurality of power supply lines configured to supply a power supply potential to the first pixels and the second pixels. At least one or more of the signal lines are provided in a layer different from a layer of the power supply lines in the first pixels, and the signal lines and the power supply lines are provided in the same layer in the second pixels.

DETAILED DESCRIPTION

Figure 1:
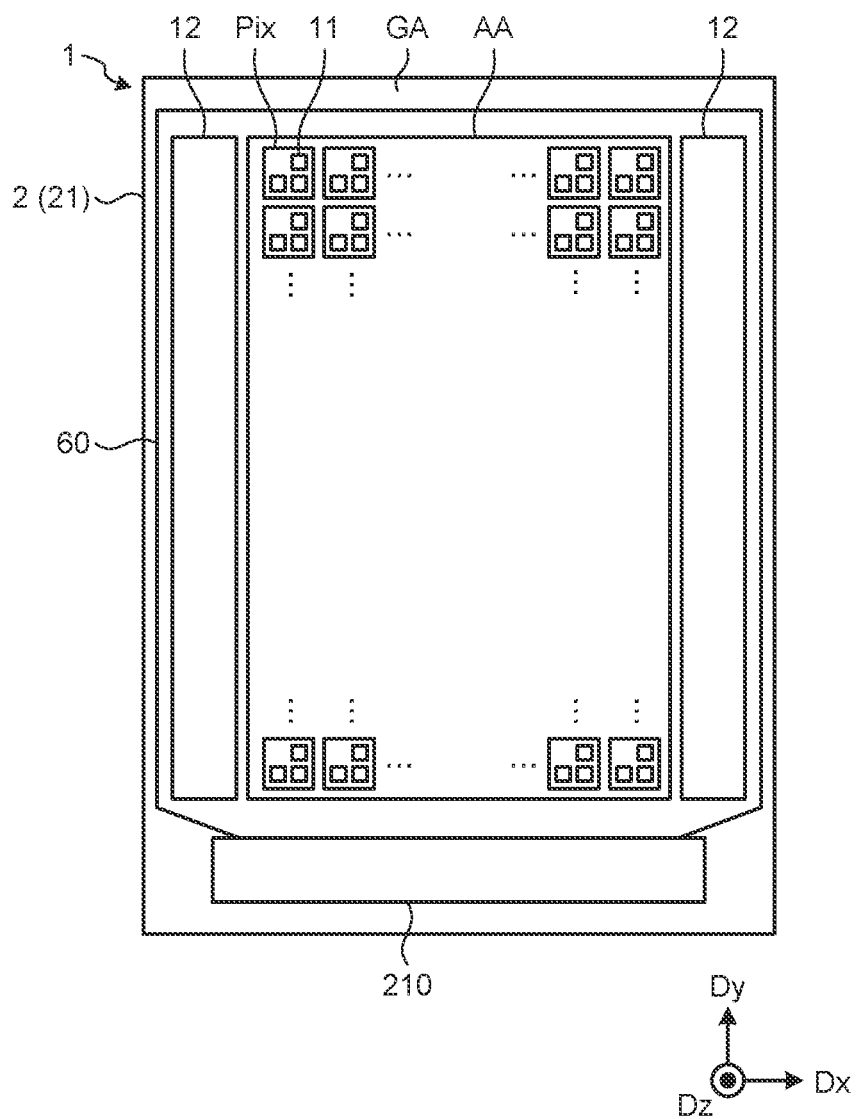
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. In the present specification, the first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a light emission control scanning line BG, a reset control scanning line RG, an initialization control scanning line IG, and a writing control scanning line SG (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 by chip-on-glass (COG) bonding. The mounting form of the drive IC 210 is not limited thereto, and the drive IC 210 may be mounted on a wiring substrate coupled to the peripheral region GA of the substrate 21 by chip-on-film (COF) bonding. The wiring substrate coupled to the substrate 21 is a flexible printed circuit board or a rigid substrate, for example.

The cathode wiring 60 is provided in the peripheral region GA of the substrate 21. The cathode wiring 60 is provided surrounding the pixels Pix in the display region AA and the drive circuits 12 in the peripheral region GA. Cathodes of respective light emitting elements 3 are electrically coupled to the common cathode wiring 60 and are supplied with a fixed potential (e.g., a ground potential). More specifically, a cathode terminal 33 (refer to FIG. 5) of the light emitting element 3 is coupled to the cathode wiring 60 via a cathode electrode 22. The cathode wiring 60 may partially have a slit and be provided as two different wires on the substrate 21.

Figure 2:
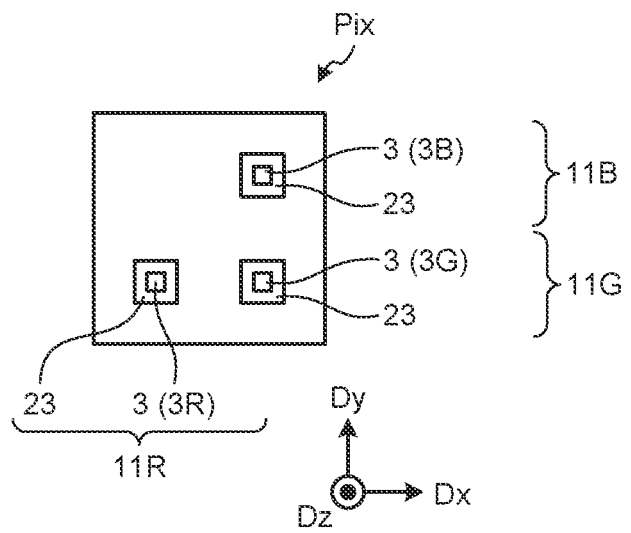
FIG. 2 is a plan view of a plurality of pixels.

FIG. 2 is a plan view of a pixel including a plurality of pixels. As illustrated in FIG. 2, one pixel Pix includes a plurality of pixels 11. The pixel Pix includes a first pixel 11R, a second pixel 11G, and a third pixel 11B, for example. The first pixel 11R displays a primary color of red as the first color. The second pixel 11G displays a primary color of green as the second color. The third pixel 11B displays a primary color of blue as the third color. In the following description, the first pixel 11R, the second pixel 11G, and the third pixel 11B are referred to as the pixels 11 when they need not be distinguished from one another.

The pixels 11 each include a light emitting element 3R, 3G, or 3B, and an anode electrode 23. In the following description, the light emitting elements 3R, 3G, and 3B are simply referred to as the light emitting elements 3 when they need not be distinguished from one another. The display device 1 displays an image by outputting different light (e.g., red, green, and blue light) from the light emitting elements 3R, 3G, and 3B in the first pixel 11R, the second pixel 11G, and the third pixel 11B, respectively.

The light emitting elements 3 are provided to each of the pixels Pix. The light emitting element 3 is an inorganic light emitting diode (LED) chip having a size of several micrometers to 300 micrometers in planar view. Typically, an element having a chip size of 100 micrometers or larger is called a mini LED, and an element having a size of several micrometers to smaller than 100 micrometers is called a micro LED. The display device 1 according to the present disclosure may include LEDs in any size, and various types of LEDs may be properly used depending on the screen size (size of one pixel) of the display device 1. The display device 1 including the micro LEDs in the respective pixels is also called a micro LED display device. The term "micro" of the micro LED is not intended to limit the size of the light emitting element 3.

As illustrated in FIG. 2, the first pixel 11R and the second pixel 11G in one pixel Pix are aligned in the first direction Dx. The second pixel 11G and the third pixel 11B are aligned in the second direction Dy. The first color, the second color, and the third color are not limited to red, green, and blue, respectively, and may be any desired colors, such as complementary colors. The light emitting elements 3R, 3G, and 3B may output different light in four or more colors. The positions of the pixels 11 are not limited to the configuration illustrated in FIG. 2. The first pixel 11R, for example, may be disposed side by side with the third pixel 11B in the first direction Dx. The first pixel 11R, the second pixel 11G, and the third pixel 11B may be repeatedly arrayed in this order in the first direction Dx.

Figure 3:
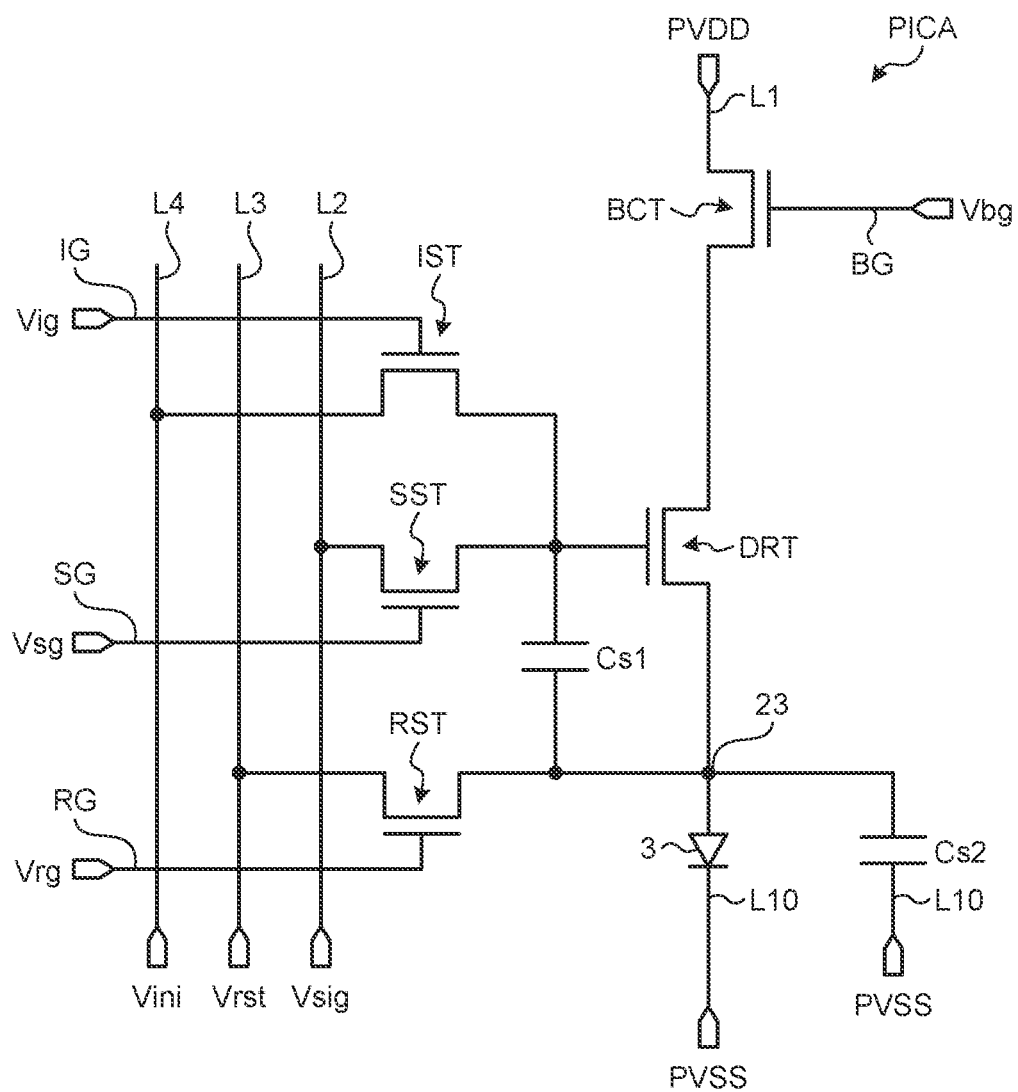
FIG. 3 is a circuit diagram of a pixel circuit.

FIG. 3 is a circuit diagram of a pixel circuit. A pixel circuit PICA illustrated in FIG. 3 is provided to each of the first pixel 11R, the second pixel 11G, and the third pixel 11B. The pixel circuit PICA is provided to the substrate 21 to supply drive signals (electric current) to the light emitting elements 3R, 3G, and 3B. The explanation of the pixel circuit PICA with reference to FIG. 3 is applicable to the respective pixel circuits PICA included in the first pixel 11R, the second pixel 11G, and the third pixel 11B.

As illustrated in FIG. 3, the pixel circuit PICA includes the light emitting element 3 (light emitting elements 3R, 3G, and 3B), five transistors, and two capacitances. Specifically, the pixel circuit PICA includes a light emission control transistor BCT, an initialization transistor IST, a writing transistor SST (second transistor), a reset transistor RST, and a drive transistor DRT (first transistor). Some of the transistors may be shared by the pixels 11 disposed side by side.

The transistors included in the pixel circuit PICA are n-type TFTs (thin-film transistors). The present embodiment is not limited thereto, and the transistors may be p-type TFTs.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 1) provided in the peripheral region GA. The drive circuits 12 supply light emission control signals Vbg, initialization control signals Vig, writing control signals Vsg, and reset control signals Vrg to the light emission control scanning line BG, the initialization control scanning line IG, the writing control scanning line SG, and the reset control scanning line RG, respectively.

The drive IC 210 (refer to FIG. 1) supplies video signals Vsig to the respective pixel circuits PICA of the first pixel 11R, the second pixel 11G, and the third pixel 11B in a time-division manner. A switching circuit, such as a multiplexer, is provided between each row of the first pixels 11R, the second pixels 11G, and the third pixels 11B and the drive IC 210. The video signals Vsig are supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the light emitting element 3 based on voltage between the gate and the drain.

The cathode (cathode terminal 33) of the light emitting element 3 is coupled to a cathode power supply line L10. The anode (anode terminal 32) of the light emitting element 3 is coupled to an anode power supply line L1 (power supply line) via the drive transistor DRT and the light emission control transistor BCT. The anode power supply line L1 is supplied with anode power supply potential PVDD. The cathode power supply line L10 is supplied with cathode power supply potential PVSS. The anode power supply potential PVDD is higher than the cathode power supply potential PVSS. The cathode power supply line L10 includes the cathode wiring 60.

The pixel circuit PICA includes the capacitance Cs1 and the capacitance Cs2. The capacitance Cs1 is holding capacitance formed between the gate and the source of the drive transistor DRT. The capacitance Cs2 is additional capacitance formed between the cathode power supply line L10 and both the source of the drive transistor DRT and the anode of the light emitting element 3.

In a reset period, the light emission control transistor BCT is turned off (electrically discontinuous state), and the reset transistor RST is turned on (electrically continuous state) based on the electric potential of the light emission control scanning line BG and the reset control scanning line RG. As a result, the electric potential of the source of the drive transistor DRT is fixed to the reset power supply potential Vrst. The reset power supply potential Vrst is set to be a potential such that the potential difference between the reset power supply potential Vrst and the cathode power supply potential PVSS is smaller than the potential difference at which the light emitting element 3 starts to emit light.

Subsequently, the initialization transistor IST is turned on based on the electric potential of the initialization control scanning line IG. The electric potential of the gate of the drive transistor DRT is fixed to the initialization potential Vini by the initialization transistor IST. The drive circuits 12 turn on the light emission control transistor BCT and turn off the reset transistor RST. When the source potential is equal to (Vini-Vth), the drive transistor DRT is turned off. As a result, variations in a threshold voltage Vth of the drive transistors DRT of the respective pixels 11 are offset.

In a subsequent video signal writing operation period, the light emission control transistor BCT is turned off, the initialization transistor IST is turned off, and the writing transistor SST is turned on. The video signals Vsig are input to the gate of the drive transistor DRT.

In a subsequent light emission operation period, the light emission control transistor BCT is turned on, and the writing transistor SST is turned off. The anode power supply potential PVDD is supplied to the drive transistor DRT from the anode power supply line L1 via the light emission control transistor BCT. The drive transistor DRT supplies an electric current corresponding to the gate-source voltage to the light emitting element 3. The light emitting element 3 emits light with the luminance corresponding to the electric current.

The configuration of the pixel circuit PICA illustrated in FIG. 3 is given by way of example only and may be appropriately modified. The number of wires and the number of transistors in one pixel 11, for example, may be different from those described above.

Figure 4:
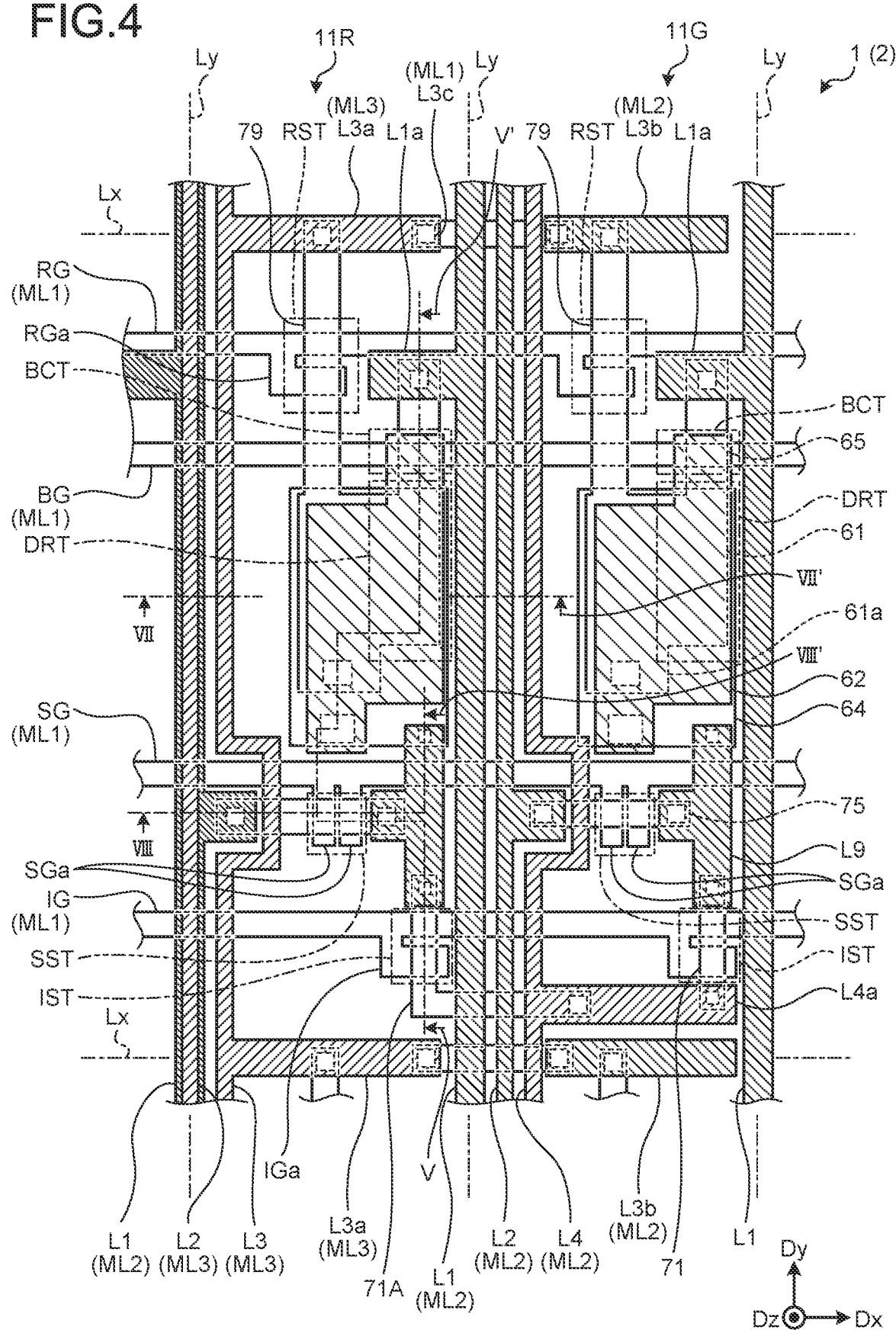
FIG. 4 is a plan view schematically illustrating two pixels disposed side by side.

The following describes a specific exemplary configuration of the transistors and the wires with reference to FIGS. 4 to 8. FIG. 4 is a plan view schematically illustrating two pixels disposed side by side. FIG. 4 illustrates the first pixel 11R and the second pixel 11G as two pixels 11 disposed side by side in the first direction Dx. Explanation of the second pixel 11G is applicable to the third pixel 11B because the third pixel 11B has the same configuration as that of the second pixel 11G.

As illustrated in FIG. 4, the anode power supply line L1, the video signal line L2, the reset signal line L3, and the initialization signal line L4 extend in the second direction Dy. The reset control scanning line RG, the light emission control scanning line BG, the writing control scanning line SG, and the initialization control scanning line IG extend in the first direction Dx and intersect the anode power supply line L1, the video signal line L2, the reset signal line L3, and the initialization signal line L4 in planar view. Coupling wiring L9 is provided between the two anode power supply lines L1 disposed side by side in the first direction Dx. The coupling wiring L9 couples the drive transistor DRT, the writing transistor SST, and the initialization transistor IST.

The first pixel 11R includes the video signal line L2 and the reset signal line L3 as the signal lines that supply signals. The second pixel 11G includes the video signal line L2 and the initialization signal line L4 as the signal lines that supply signals. The reset signal line L3 and the initialization signal line L4 according to the present embodiment are shared by the two pixels 11 disposed side by side. In other words, the first pixel 11R is not provided with the initialization signal line L4 and is provided with the reset signal line L3 along the video signal line L2. The second pixel 11G is not provided with the reset signal line L3 and is provided with the initialization signal line L4 along the video signal line L2. The reset signal line L3 may be provided to the second pixel 11G, and the initialization signal line L4 may be provided to the first pixel 11R. The first pixel 11R, for example, is not necessarily provided with the reset signal line L3 and may be provided with the initialization signal line L4 along the video signal line L2. The second pixel 11G is not necessarily provided with the initialization signal line L4 and may be provided with the reset signal line L3 along the video signal line L2.

One reset signal line L3 supplies the reset power supply potential Vrst to the first pixel 11R and the second pixel 11G. One initialization signal line L4 supplies the initialization potential Vini to the first pixel 11R and the second pixel 11G. The present embodiment is not limited thereto, and the first pixel 11R and the second pixel 11G may each include three signal lines, that is, the video signal line L2, the reset signal line L3, and the initialization signal line L4.

The display device 1 (array substrate 2) according to the present embodiment includes a first metal layer ML1, a second metal layer ML2, and a third metal layer ML3 provided in different layers in the third direction Dz. The first metal layer ML1, the second metal layer ML2, and the third metal layer ML3 are provided in the layers different from that of semiconductor layers 61, 65, 71, 75, and 79 of the transistors. At least two of the first metal layer ML1, the second metal layer ML2, and the third metal layer ML3 may be provided in different layers, and desirably, all of the first metal layer ML1, the second layer ML2, and the third layer ML3 may be provided in different layers. In FIG. 4, the second metal layer ML2 and the third metal layer ML3 are hatched to distinguish the first metal layer ML1 from the second metal layer ML2 and the third metal layer ML3.

The reset control scanning line RG, the light emission control scanning line BG, the writing control scanning line SG, and the initialization control scanning line IG are made of the first metal layer ML1. In the first pixel 11R, the anode power supply line L1 is made of the second metal layer ML2. The video signal line L2 and the reset signal line L3 are made of the third metal layer ML3. In other words, the video signal line L2 and the reset signal line L3 are provided in a layer different from that of the anode power supply line L1. The video signal line L2 is provided overlapping the anode power supply line L1 in planar view. The reset signal line L3 and the video signal line L2 are provided side by side in the first direction Dx.

In the second pixel 11G, the anode power supply line L1, the video signal line L2, and the initialization signal line L4 are made of the second metal layer ML2. In other words, the video signal line L2 and the initialization signal line L4 are provided in the same layer as that of the anode power supply line L1. The video signal line L2 and the initialization signal line L4 are provided in a region not overlapping the anode power supply line L1 in planar view. The video signal line L2, the initialization signal line L4, and the anode power supply line L1 are provided side by side in the first direction Dx.

At least one or more of the signal lines included in the first pixel 11R are provided in a layer different from that of the anode power supply line L1. This configuration enables efficiently disposing the wiring in the first pixel 11R. As a result, the display device 1 can make the metal wiring occupancy of the first pixel 11R smaller than that of the second pixel 11G. The metal wiring occupancy indicates the ratio of the total area of parts of overlapping various kinds of metal wiring including the signal lines, the scanning lines, and the anode power supply line L1 to the area of the first pixel 11R or the second pixel 11G in planar view.

The area of each pixel 11 corresponds to the area of the region defined by virtual lines Lx and virtual lines Ly illustrated in FIG. 4. The virtual line Lx overlaps coupling wiring L3a and L3b coupled to the reset signal lines L3 and extends in the first direction Dx. The virtual line Lx passes through the middle point of the coupling wiring L3a and L3b in the second direction Dy. The virtual line Ly overlaps the anode power supply line L1 and extends in the second direction Dy. The virtual line Ly passes through the middle point of the anode power supply line L1 in the first direction Dx.

The metal wiring occupancy of the first pixel 11R is approximately 64% to 80%, and specifically is approximately 72%, for example. The metal wiring occupancy of the second pixel 11G is approximately 72% to 80%, and specifically is approximately 80%, for example. The metal wiring occupancy of the first pixel 11R and the second pixel 11G is given by way of example only and may be appropriately different values depending on the pixel density and the resolution.

This configuration can prevent light traveling in the side and diagonal directions in the red light output from the light emitting element 3R of the first pixel 11R from being reflected by the metal wiring on the array substrate 2 compared with a case where the video signal line L2 and the reset signal line L3 are provided in the same layer as that of the anode power supply line L1 in the first pixel 11R. Consequently, the display device 1 can prevent unnecessary reflection of light in the first pixel 11R, thereby preventing color mixture with light output from other pixels 11.

The first metal layer ML1, the second metal layer ML2, and the third metal layer ML3 are made of titanium (Ti), molybdenum (Mo), tungsten (W), tantalum (Ta), niobium, indium tin oxide (ITO), aluminum (Al), silver (Ag), Ag alloy, copper (Cu), carbon nanotube, graphite, graphene, or carbon nanobud, for example. The sheet resistance of the anode power supply line L1 made of the second metal layer ML2 is equal to or lower than that of the signal lines (third metal layer ML3) provided in a layer different from that of the anode power supply line L1 out of the signal lines. The sheet resistance of the signal lines made of the third metal layer ML3 is equal to or lower than that of the gate lines made of the first metal layer ML1.

The sheet resistance of the anode power supply line L1 (second metal layer ML2) is 30 mΩ to 120 mΩ, for example. The sheet resistance of the signal lines made of the third metal layer ML3 out of the signal lines is 120 mΩ to 300 mΩ. The sheet resistance of the gate lines (first metal layer ML1) is 300 mΩ to 3000 mΩ. With this configuration, the display device 1 can prevent a drive voltage applied to the anode power supply line L1 from dropping, thereby preventing deterioration of display quality.

The first metal layer ML1, the second metal layer ML2, and the third metal layer ML3 are not limited to single layers and may be multilayered films. The second metal layer ML2 may be a multilayered film of Ti/Al/Ti or Mo/Al/MO, for example. The third metal layer ML3 may be a single-layered film made of Al. Ti, Al, and Mo may be alloys.

The semiconductor layers 61, 65, 71, and 75 are made of amorphous silicon, microcrystalline oxide semiconductor, amorphous oxide semiconductor, polycrystalline silicon, low-temperature polycrystalline silicon (LTPS), or gallium nitride (GaN), for example. Examples of the oxide semiconductor include, but are not limited to, IGZO, zinc oxide (Zn0), ITZO, etc. IGZO is indium gallium zinc oxide, and ITZO is indium tin zinc oxide.

The drive transistor DRT includes the semiconductor layer 61, a source electrode 62, and a gate electrode 64. The semiconductor layer 61, the source electrode 62, and the gate electrode 64 at least partially overlap with each other in planar view and are provided in a region surrounded by the two anode power supply lines L1 disposed side by side in the first direction Dx, the light emission control scanning line BG, and the writing control scanning line SG. The drive transistor DRT has a single-gate structure in which one gate electrode 64 is provided overlapping the semiconductor layer 61. The source electrode 62 is provided covering the semiconductor layer 61. The semiconductor layer 61 is coupled to the source electrode 62 via a part 61a.

The light emission control transistor BCT includes the semiconductor layer 65. The semiconductor layer 65 is coupled to the semiconductor layer 61 and intersects the light emission control scanning line BG in planar view. In the semiconductor layer 65, a region overlapping the light emission control scanning line BG serves as a channel region. The part of the light emission control scanning line BG overlapping the semiconductor layer 65 functions as a gate electrode 66 of the light emission control transistor BCT. One end of the semiconductor layer 65 is electrically coupled to an anode power supply line coupling part L1a. The anode power supply line coupling part L1a is a part branched off from the anode power supply line L1 in the first direction Dx. With this configuration, the drive transistor DRT and the light emission control transistor BCT are supplied with the anode power supply potential PVDD from the anode power supply line L1.

In the second pixel 11G, the initialization transistor IST includes the semiconductor layer 71. In the first pixel 11R, the initialization transistor IST includes a semiconductor layer 71A. The semiconductor layers 71 and 71A intersect the initialization control scanning line IG and a branch scanning line IGa in planar view. In the semiconductor layers 71 and 71A, a region overlapping the initialization control scanning line IG and the branch scanning line IGa serves as a channel region. The branch scanning line IGa is branched off from the initialization control scanning line IG and extends in the first direction Dx. The parts of the initialization control scanning line IG and the branch scanning line IGa overlapping the semiconductor layers 71 and 71A each function as a gate electrode 74 of the initialization transistor IST. In other words, the initialization transistor IST has a double-gate structure in which two gate electrodes are provided overlapping the respective semiconductor layers 71 and 71A. The initialization transistor IST is not necessarily provided with the branch scanning line IGa and may have a single-gate structure.

In the second pixel 11G, the semiconductor layer 71 extends in the second direction Dy. One end of the semiconductor layer 71 is electrically coupled to the coupling wiring L9, and the other end is coupled to coupling wiring L4a. The coupling wiring L4a is a part branched off from the initialization signal line L4 in the first direction Dx. In the first pixel 11R, the semiconductor layer 71A includes a part extending in the second direction Dy and a part extending in the first direction Dx. One end of the part of the semiconductor layer 71A extending in the second direction Dy is electrically coupled to the coupling wiring L9. The part of the semiconductor layer 71A extending in the first direction Dx intersects the anode power supply line L1 and the video signal line L2 in planar view, extends to the second pixel 11G, and is electrically coupled to the coupling wiring L4a. With this configuration, one initialization signal line L4 is electrically coupled to the two initialization transistors IST and is shared by the two pixels 11 disposed side by side in the first direction Dx.

The writing transistor SST includes the semiconductor layer 75. The semiconductor layer 75 extends in the first direction Dx and intersects two branch scanning lines SGa in planar view. In the semiconductor layer 75, a region overlapping the two branch scanning lines SGa serves as a channel region. The two branch scanning lines SGa are parts branched off from the writing control scanning line SG in the second direction Dy. The parts of the two branch scanning lines SGa overlapping the semiconductor layer 75 each function as a gate electrode 78 of the writing transistor SST. In other words, the writing transistor SST has a double-gate structure in which two gate electrodes 78 are provided overlapping the semiconductor layer 75. The writing transistor SST may have a single-gate structure in which one branch scanning line SGa is provided.

One end of the semiconductor layer 75 is coupled to the video signal line L2, and the other end is coupled to the coupling wiring L9. In the first pixel 11R, one end of the semiconductor layer 75 is coupled to the video signal line L2 made of the third metal layer ML3. In the second pixel 11G, one end of the semiconductor layer 75 is coupled to the video signal line L2 made of the second metal layer ML2.

The reset transistor RST includes the semiconductor layer 79. The semiconductor layer 79 extends in the second direction Dy and intersects the reset control scanning line RG and a branch scanning line RGa in planar view. In the semiconductor layer 79, a region overlapping the reset control scanning line RG and the branch scanning line RGa serves as a channel region. The branch scanning line RGa is branched off from the reset control scanning line RG and extends in the first direction Dx. The parts of the reset control scanning line RG and the branch scanning line RGa overlapping the semiconductor layer 79 each function as a gate electrode of the reset transistor RST. In other words, the reset transistor RST has a double-gate structure. The reset transistor RST is not necessarily provided with the branch scanning line RGa and may have a single-gate structure.

The reset signal line L3 is coupled to the coupling wiring L3a and L3b and a bridge L3c extending in the first direction Dx. The coupling wiring L3a is provided to the first pixel 11R and is made of the third metal layer ML3. The bridge L3c intersects the anode power supply line L1, the video signal line L2, and the initialization signal line L4 in planar view and couples the coupling wiring L3a and the coupling wiring L3b. The bridge L3c is made of a layer different from that of the anode power supply line L1 (second metal layer ML2), that is, the first metal layer ML1, for example. The coupling wiring L3b is provided to the second pixel 11G and is made of the second metal layer ML2.

In the first pixel 11R, one end of the semiconductor layer 79 is coupled to the coupling wiring L3a. In the second pixel 11G, one end of the semiconductor layer 79 is coupled to the coupling wiring L3b. The other ends of the semiconductor layers 79 are each coupled to the semiconductor layer 61. In other words, the other end of the semiconductor layer 79 of the reset transistor RST is electrically coupled to the source of the drive transistor DRT and the anode terminal 32 of the light emitting element 3. With this configuration, one reset signal line L3 is electrically coupled to the two reset transistors RST and is shared by the two pixels 11 disposed side by side in the first direction Dx.

The drive transistor DRT and the light emission control transistor BCT that supply the drive current to the light emitting element 3 according to the present embodiment has a single-gate structure. The initialization transistor IST, the writing transistor SST, and the reset transistor RST have a double-gate structure. This configuration can prevent current leakage in the initialization transistor IST, the writing transistor SST, and the reset transistor RST.

Figure 5:
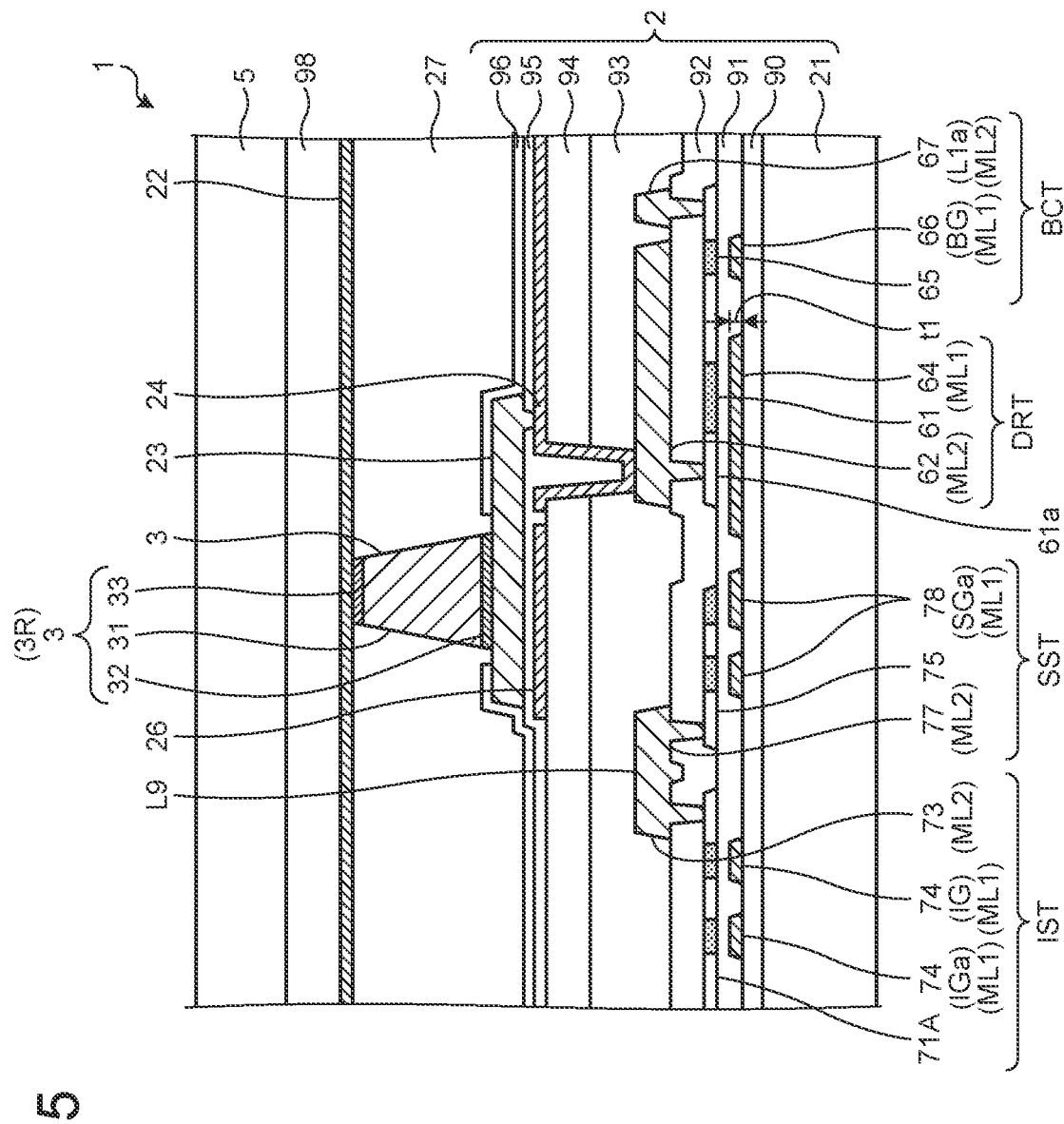
FIG. 5 is a sectional view along line V-V' of FIG. 4.

The following describes a sectional configuration of the display device 1. FIG. 5 is a sectional view along line V-V' of FIG. 4. As illustrated in FIG. 5, the light emitting elements 3 are provided on the array substrate 2 in the display device 1. The array substrate 2 includes the substrate 21, the anode electrodes 23, counter electrodes 26, coupling electrodes 24, various transistors, various kinds of wiring, and various insulating films.

The substrate 21 is an insulating substrate and is a glass substrate made of quartz or non-alkali glass or a resin substrate made of polyimide, for example.

In the present specification, a direction from the substrate 21 toward the light emitting element 3 in a direction perpendicular to the surface of the substrate 21 is referred to as an "upper side" or simply as "up". A direction from the light emitting element 3 to the substrate 21 is referred to as a "lower side" or simply as "down". To describe an aspect where a first structure is disposed on a second structure, the term "on" includes both of the following cases unless otherwise noted: a case where the first structure is disposed directly on the second structure in contact with the second structure, and a case where the first structure is disposed on the second structure with another structure interposed therebetween.

The drive transistor DRT, the light emission control transistor BCT, the initialization transistor IST, the writing transistor SST, and the reset transistor RST are provided on a first surface of the substrate 21. Detailed explanation of the reset transistor RST is omitted herein because it has the same layer configuration as that of the initialization transistor IST and the writing transistor SST.

An undercoat film 90 is provided on the substrate 21. The undercoat film 90, insulating films 91, 92, and 93, and insulating films 95 and 96 are inorganic insulating films made of silicon oxide ($SiO_2$) or silicon nitride (SiN), for example.

The gate electrodes 64, 66, 74, and 78 made of the first metal layer ML1 are provided on the undercoat film 90. The insulating film 91 is provided on the undercoat film 90 to cover the gate electrodes 64, 66, 74, and 78. The semiconductor layers 61, 65, 71A, and 75 are provided on the insulating film 91. The insulating film 92 is provided on the insulating film 91 to cover the semiconductor layers 61, 65, 71A, and 75.

The source electrode 62 and the drain electrodes 67, 73, and 77 made of the second metal layer ML2 are each electrically coupled to the semiconductor layer through a contact hole formed in the insulating film 92. The coupling wiring L9 electrically couples the drain of the writing transistor SST and the drain of the initialization transistor IST.

The gate electrode 64 and the source electrode 62 facing each other with the insulating films 91 and 92 interposed therebetween form the capacitance Cs1. The capacitance Cs1 includes capacitance formed by the gate electrode 64 and the coupling electrode 24 facing each other with the insulating films 93 and 94 interposed therebetween.

The insulating film 93 is provided on the insulating film 92 to cover the source electrode 62 and the drain electrodes 67, 73, and 77. The insulating film 94 is provided on the insulating film 93 to cover the transistors. The insulating film 94 is made of organic material, such as photosensitive acrylic. The insulating film 94 is a flattening film that can flatten unevenness formed by the drive transistor DRT and various kinds of wiring.

The coupling electrode 24 and the counter electrode 26 are provided on the insulating film 94. The coupling electrode 24 is coupled to the source electrode 62 through a contact hole formed in the insulating film 93 and the insulating film 94. The coupling electrode 24 and the counter electrode 26 are made of translucent conductive material, such as indium tin oxide (ITO).

The anode electrode 23 is electrically coupled to the coupling electrode 24 and the source electrode 62 through a contact hole formed in the insulating film 95. As a result, the anode electrode 23 is electrically coupled to the drive transistor DRT. The anode electrode 23 has a multilayered structure of Mo and Al, for example.

The capacitance Cs2 is formed between the anode electrode 23 and the counter electrode 26 facing each other with the insulating film 95 interposed therebetween. The insulating film 96 is provided to cover the anode electrode 23. The insulating film 96 covers the periphery of the anode electrode 23 and insulates the anode electrodes 23 of the pixels 11 disposed side by side.

The insulating film 96 has an opening for mounting the light emitting element 3 at a position overlapping the anode electrode 23. The size of the opening of the insulating film 96 is larger than the area of the light emitting element 3 considering the amount of mounting misalignment in the process of mounting the light emitting element 3, for example. In other words, the area of the anode electrode 23 is larger than that of the light emitting element 3 in planar view seen from the direction perpendicular to the substrate 21.

The light emitting element 3 includes a semiconductor layer 31, the anode terminal 32, and the cathode terminal 33. The light emitting element 3 is mounted such that the anode terminal 32 is in contact with the anode electrode 23. With this configuration, the semiconductor layer 61 of the drive transistor DRT is electrically coupled to the light emitting element 3 via the source electrode 62 made of the second metal layer ML2. The anode electrode 23 supplies the anode power supply potential PVDD to the anode terminal 32. The semiconductor layer 31 may have a multilayered structure of an n-type cladding layer, an active layer, and a p-type cladding layer.

The semiconductor layer 31 is made of a compound semiconductor, such as gallium nitride (GaN), aluminum indium gallium phosphorous (AlInGaP), aluminum gallium arsenide (AlGaAs), and gallium arsenide phosphorous (GaAsP). The semiconductor layer 31 may be made of different materials depending on the light emitting elements 3R, 3G, and 3B. The active layer may have a multi-quantum well structure (MQW structure) in which well layers and barrier layers composed of several atomic layers are cyclically layered for high efficiency.

An element insulating film 27 is provided between a plurality of light emitting elements 3. The element insulating film 27 is made of resin material. The element insulating film 27 covers the side surfaces of the light emitting element 3 at least, and the element insulating film 27 is not provided on the cathode terminal 33 of the light emitting element 3. The element insulating film 27 is flattened such that the upper surface of the element insulating film 27 and the upper surface of the cathode terminal 33 form a single plane. The position of the upper surface of the element insulating film 27 may be different from that of the upper surface of the cathode terminal 33.

The cathode electrode 22 covers a plurality of light emitting elements 3 and the element insulating film 27 and is electrically coupled to the light emitting elements 3. More specifically, the cathode electrode 22 is provided over the upper surface of the element insulating film 27 and the upper surface of the cathode terminal 33. The cathode electrode 22 supplies the cathode power supply potential PVSS to the cathode terminal 33. The cathode electrode 22 is made of translucent conductive material, such as ITO. This configuration can effectively extract the light output from the light emitting elements 3 to the outside.

A circularly polarizing plate 5 is provided on the cathode electrode 22 with an adhesive layer 98 interposed therebetween. In other words, the circularly polarizing plate 5 is provided on a plurality of light emitting elements 3. The circularly polarizing plate 5 includes a linearly polarizing plate and a quarter retardation plate (also called a quarter wavelength plate) provided on one surface of the linearly polarizing plate, for example. The quarter retardation plate is provided closer to the substrate 21 than the linearly polarizing plate is.

External light (incident light), for example, passes through the linearly polarizing plate, thereby being converted into linearly polarized light. The linearly polarized light passes through the quarter retardation plate, thereby being converted into circularly polarized light. The circularly polarized light is reflected by the metal wiring of the array substrate 2, thereby being converted into circularly polarized light (reflected light) turning in a direction opposite to the direction of the incident light. The reflected light passes through the quarter retardation plate again, thereby being converted into linearly polarized light orthogonal to the incident light and absorbed by the linearly polarizing plate. As a result, the display device 1 prevents reflection of external light.

Figure 6:
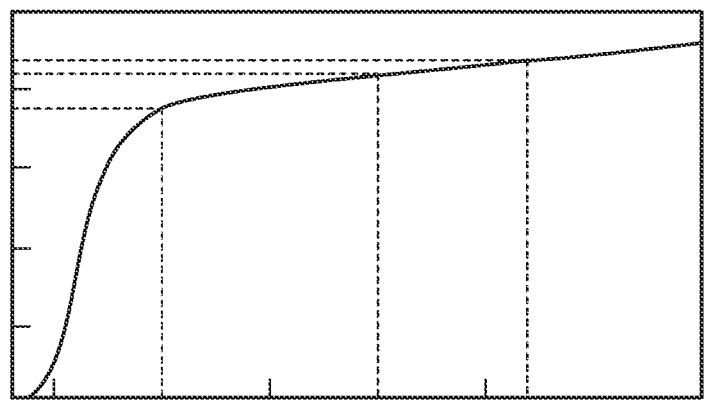
FIG. 6 is a graph schematically illustrating the wavelength dependence of light transmittance of a circularly polarizing plate.

FIG. 6 is a graph schematically illustrating the wavelength dependence of light transmittance of the circularly polarizing plate. In FIG. 6, the vertical axis indicates the transmittance of light passing through the circularly polarizing plate 5, and the horizontal axis indicates the wavelength of light. As illustrated in FIG. 6, the circularly polarizing plate 5 has the tendency that the transmittance of light becomes higher as the wavelength becomes longer. In the wavelength range of blue light (e.g., a wavelength of 450 nm), the transmittance is 38% or higher. In the wavelength range of green light (e.g., a wavelength of 550 nm), the transmittance is 41% or higher. In the wavelength range of red light (e.g., a wavelength of 620 nm), the transmittance is 44% or higher.

The circularly polarizing plate 5 is manufactured by causing a polyvinyl-alcohol-based film to absorb a dichroic substance, such as iodine and dichroic dye, and uniaxially stretching the film, for example. The circularly polarizing plate 5 can achieve the wavelength dependence illustrated in FIG. 6 due to the absorption characteristics of polyiodide complex ($I_3^-$ and $I_5^-$) oriented in the absorption axis direction.

The display device 1 can increase the extraction efficiency of light output from the light emitting element 3R because the circularly polarizing plate 5 has higher transmittance for red light than for blue or green light. If the luminous efficacy of the light emitting element 3R is lower than that of the light emitting elements 3G and 3B, the display device 1 can prevent reduction in intensity of red light caused when the red light is passing through the circularly polarizing plate 5. Consequently, the display device 1 can prevent deterioration of the quality of a displayed image. As illustrated in FIG. 4, the video signal line L2 is provided overlapping the anode power supply line L1 in the first pixel 11R. If the circularly polarizing plate 5 has higher transmittance for red light, the display device 1 can prevent reflection of light in the first pixel 11R, thereby preventing color mixture with light output from other pixels 11.

Figure 7:
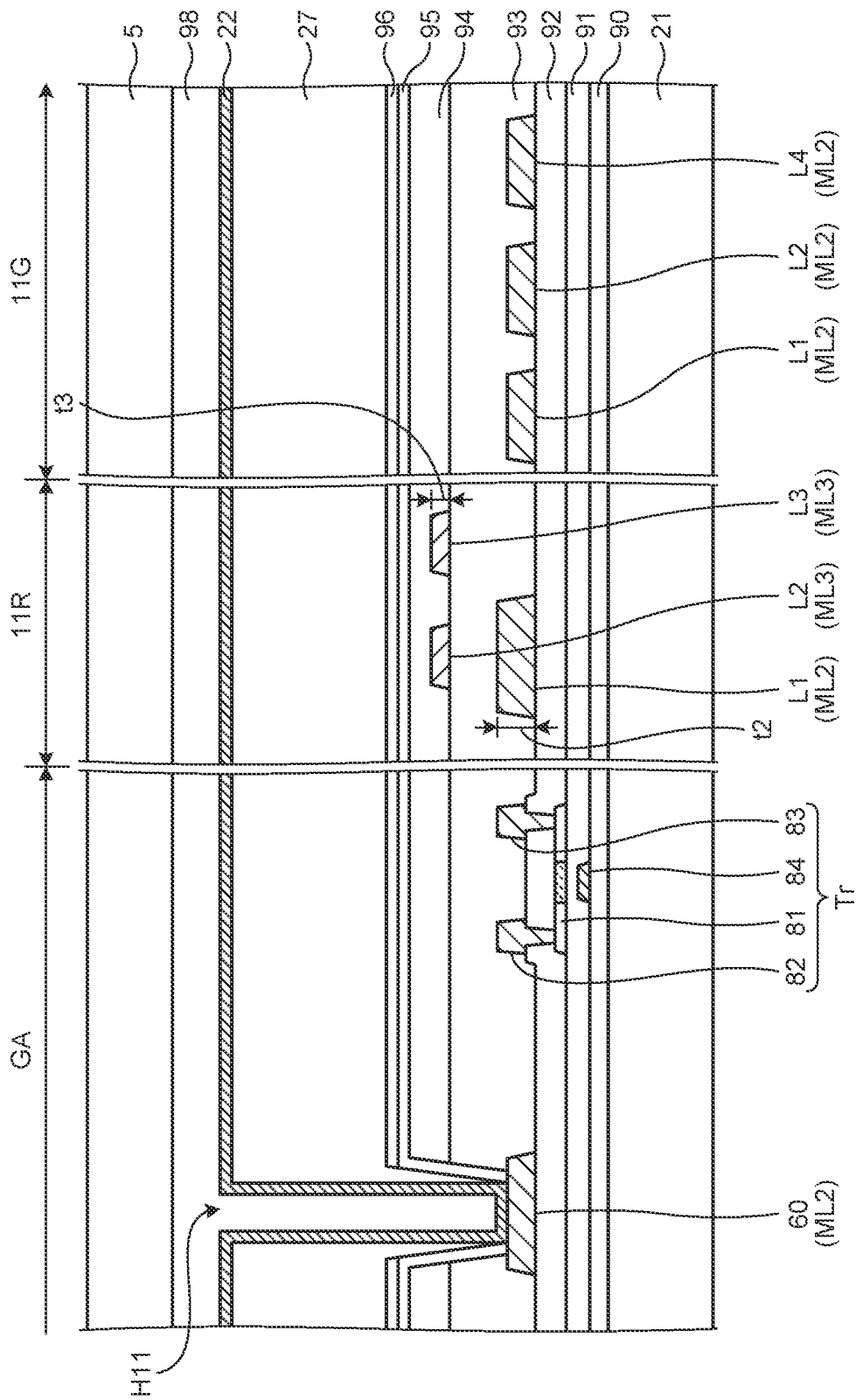
FIG. 7 is a sectional view along line VII-VII' of FIG. 4.

FIG. 7 is a sectional view along line VII-VII' of FIG. 4. FIG. 7 schematically illustrates the cathode wiring 60 and a transistor Tr provided in the peripheral region GA.

As illustrated in FIG. 7, the peripheral region GA of the substrate 21 is provided with the transistors Tr serving as a plurality of transistors included in the drive circuits 12 (refer to FIG. 1) and the cathode wiring 60. The cathode wiring 60 is made of the second metal layer ML2 and is provided on the insulating film 92 in the peripheral region GA. The cathode electrode 22 is provided from the display region AA to the peripheral region GA and is electrically coupled to the cathode wiring 60 through a contact hole H11 formed in the insulating films 93 and 94 and the element insulating film 27. The cathode wiring 60 may be made of the third metal layer ML3 and be provided on the insulating film 93.

The transistor Tr includes a semiconductor layer 81, a source electrode 82, a drain electrode 83, and a gate electrode 84. Detailed explanation of the transistor Tr is omitted herein because it has the same layer configuration as that of the transistors included in the pixel circuit PICA. The source electrode 82 and the drain electrode 83 of the transistor Tr may be coupled to wiring made of the third metal layer ML3. This configuration enables efficiently disposing the wiring in the peripheral region GA including the drive circuits 12.

In the first pixel 11R, the anode power supply line L1 is provided on the insulating film 92, and the video signal line L2 and the reset signal line L3 are provided on the insulating film 93 as illustrated in FIG. 7. The video signal line L2 is provided on the anode power supply line L1. The reset signal line L3 is provided at a position not overlapping the anode power supply line L1. In the second pixel 11G, the anode power supply line L1, the video signal line L2, and the initialization signal line L4 are provided in the same layer on the insulating film 92.

In the first pixel 11R, the width of the anode power supply line L1 is larger than that of the video signal line L2 and the reset signal line L3. The thickness t2 of the anode power supply line L1 made of the second metal layer ML2 is thicker than the thickness t1 (refer to FIG. 5) of the gate electrode 64 made of the first metal layer ML1. The thickness t2 of the anode power supply line L1 made of the second metal layer ML2 is thicker than the thickness t3 of the video signal line L2 and the reset signal line L3 made of the third metal layer ML3. The thickness of the anode power supply line L1 in the first pixel 11R is thicker than that of the anode power supply line L1 in the second pixel 11G. This configuration can reduce the resistance of the anode power supply line L1 in the first pixel 11R. The present embodiment is not limited thereto, and the thickness of the anode power supply line L1 in the first pixel 11R may be equal to that of the anode power supply line L1 in the second pixel 11G.

The layer configuration of the wiring may be appropriately modified. In the first pixel 11R, at least one of the video signal line L2 and the reset signal line L3 simply needs to be provided in a layer different from that of the anode power supply line L1. In the first pixel 11R, for example, one of the video signal line L2 and the reset signal line L3 may be provided in the same layer as that of the anode power supply line L1. The reset signal line L3 may be provided on the anode power supply line L1, and the video signal line L2 may be provided at a position not overlapping the anode power supply line L1.

Figure 8:
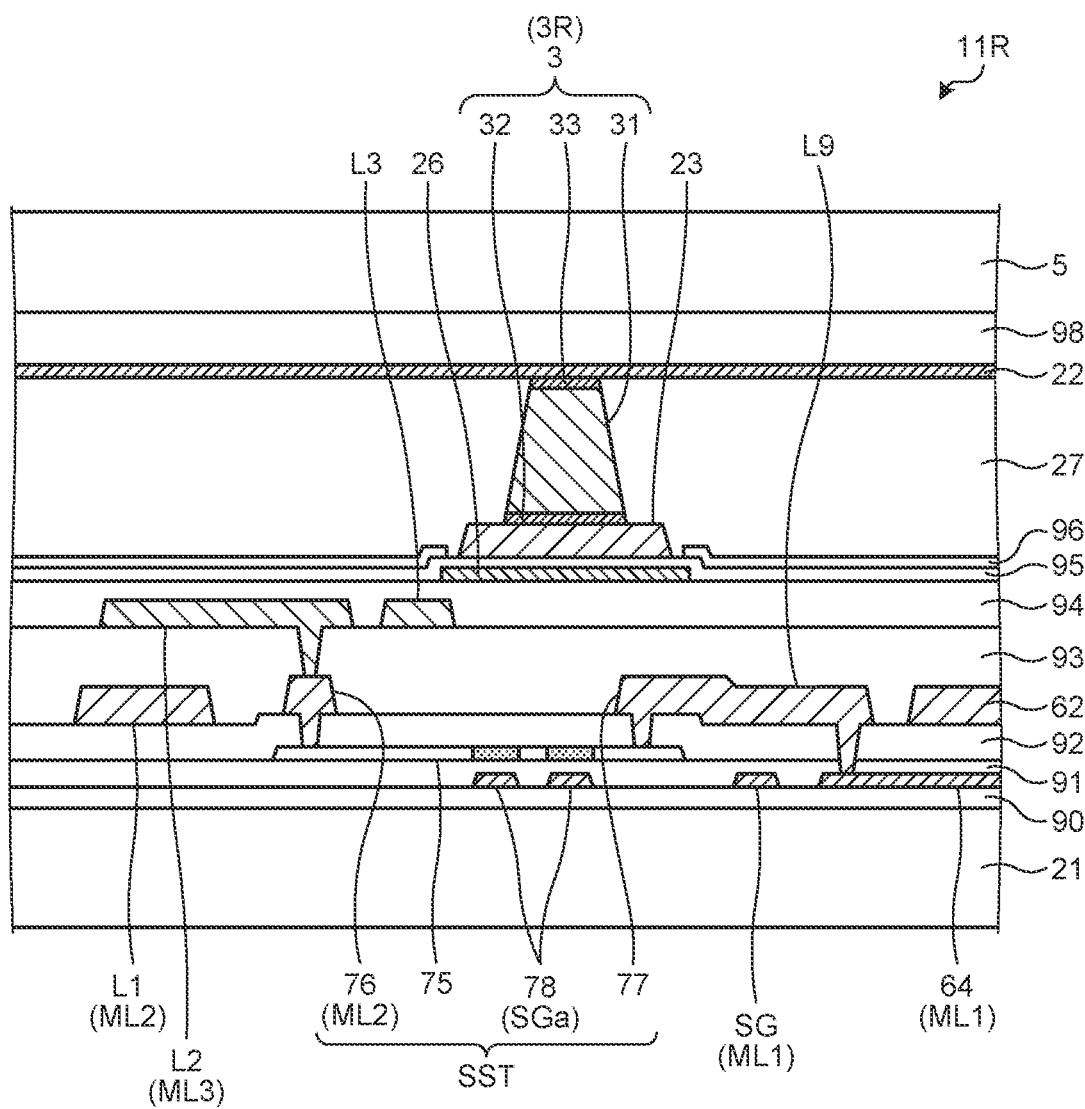
FIG. 8 is a sectional view along line VIII-VIII' of FIG. 4.

FIG. 8 is a sectional view along line VIII-VIII' of FIG. 4. FIG. 8 illustrates a sectional view of the writing transistor SST as an example of a coupling configuration of the transistors included in the pixel circuit PICA of the first pixel 11R. The semiconductor layer 75 of the writing transistor SST is electrically coupled to the video signal line L2 made of the third metal layer ML3. Specifically, the writing transistor SST includes a source electrode 76 made of the second metal layer ML2. The source electrode 76 is coupled to the semiconductor layer 75 through a contact hole formed in the insulating film 92. The video signal line L2 is coupled to the source electrode 76 through a contact hole formed in the insulating film 93. In the second pixel 11G, the video signal line L2 is made of the second metal layer ML2 and is coupled to the semiconductor layer 75 through a contact hole formed in the insulating film 92 as illustrated in FIG. 4.

The coupling wiring L9 (drain electrode 77) is coupled to the semiconductor layer 75 through a contact hole formed in the insulating film 92. The coupling wiring L9 is coupled to the gate electrode 64 of the drive transistor DRT through a contact hole formed in the insulating films 91 and 92. With this configuration, the gate electrode 64 of the drive transistor DRT is electrically coupled to the writing transistor SST via the coupling wiring L9 made of the second metal layer ML2. The coupling wiring L9 may be provided in the third metal layer ML3.

The configurations of the pixels 11 illustrated in FIGS. 4, 5, 7, and 8 are given by way of example only and may be appropriately modified. The positions of the transistors in planar view in one pixel circuit PICA, for example, are not limited to those illustrated in FIG. 4. The thickness and the width of the wiring may be appropriately modified as necessary.

Second Embodiment

Figure 9:
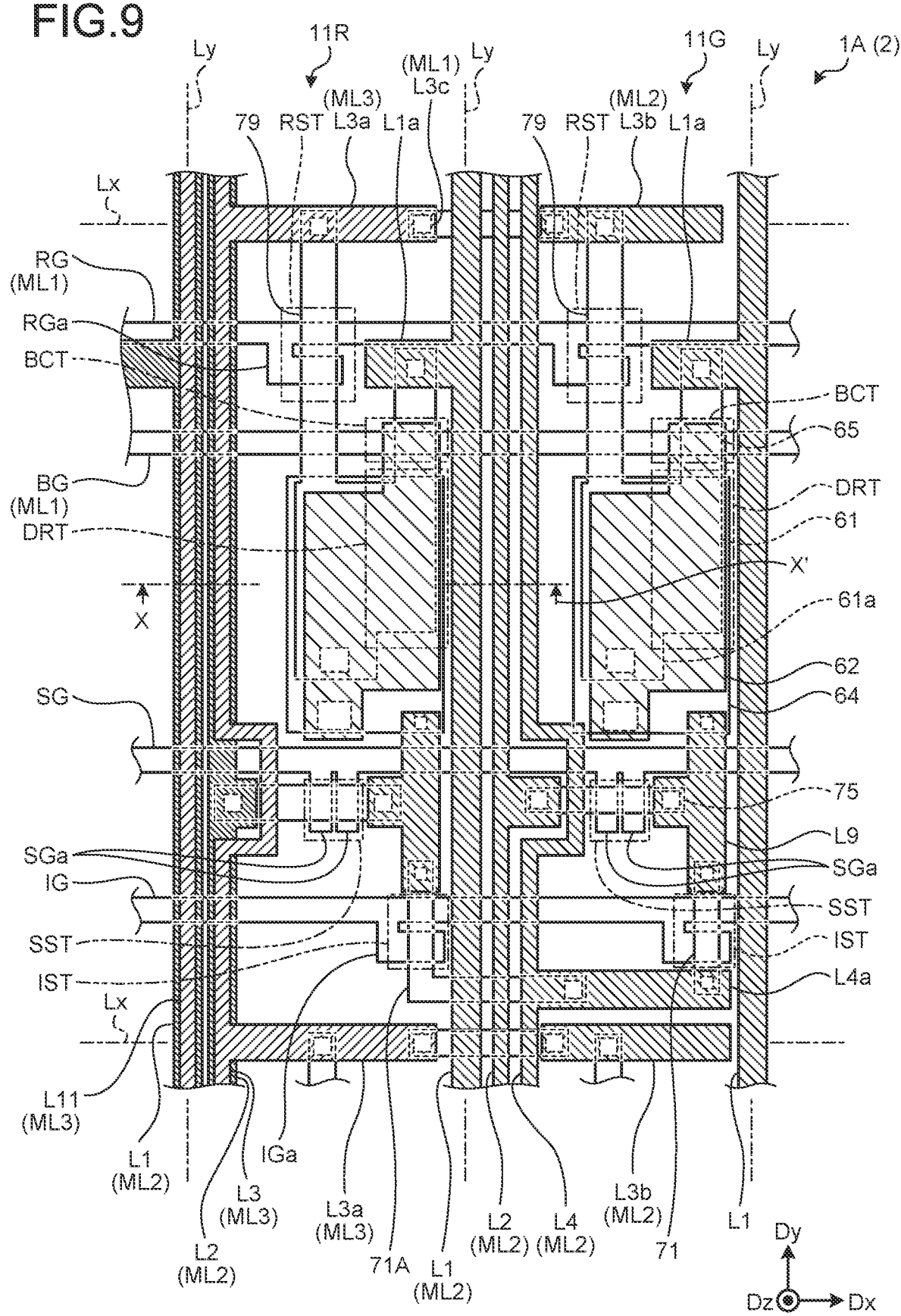
FIG. 9 is a plan view schematically illustrating two pixels disposed side by side in the display device according to a second embodiment.

FIG. 9 is a plan view schematically illustrating two pixels disposed side by side in the display device according to a second embodiment. In the following description, the same components as those described in the embodiment above are denoted by like reference numerals, and overlapping explanation thereof is omitted.

As illustrated in FIG. 9, a display device 1A according to the second embodiment is different from the first embodiment in that the reset signal line L3 in the first pixel 11R is provided overlapping the video signal line L2. More specifically, the video signal line L2 is made of the second metal layer ML2 and is disposed side by side with the anode power supply line L1 in the first direction Dx. The reset signal line L3 is made of the third metal layer ML3 and is provided at a position not overlapping the anode power supply line L1 in planar view.

The first pixel 11R further includes overlapping wiring L11. The overlapping wiring L11 extends in the second direction Dy and is provided overlapping the anode power supply line L1 in planar view. The overlapping wiring L11 is made of the third metal layer ML3 and is provided in the same layer as that of the reset signal line L3. The overlapping wiring L11 is electrically coupled to the anode power supply line L1.

Figure 10:
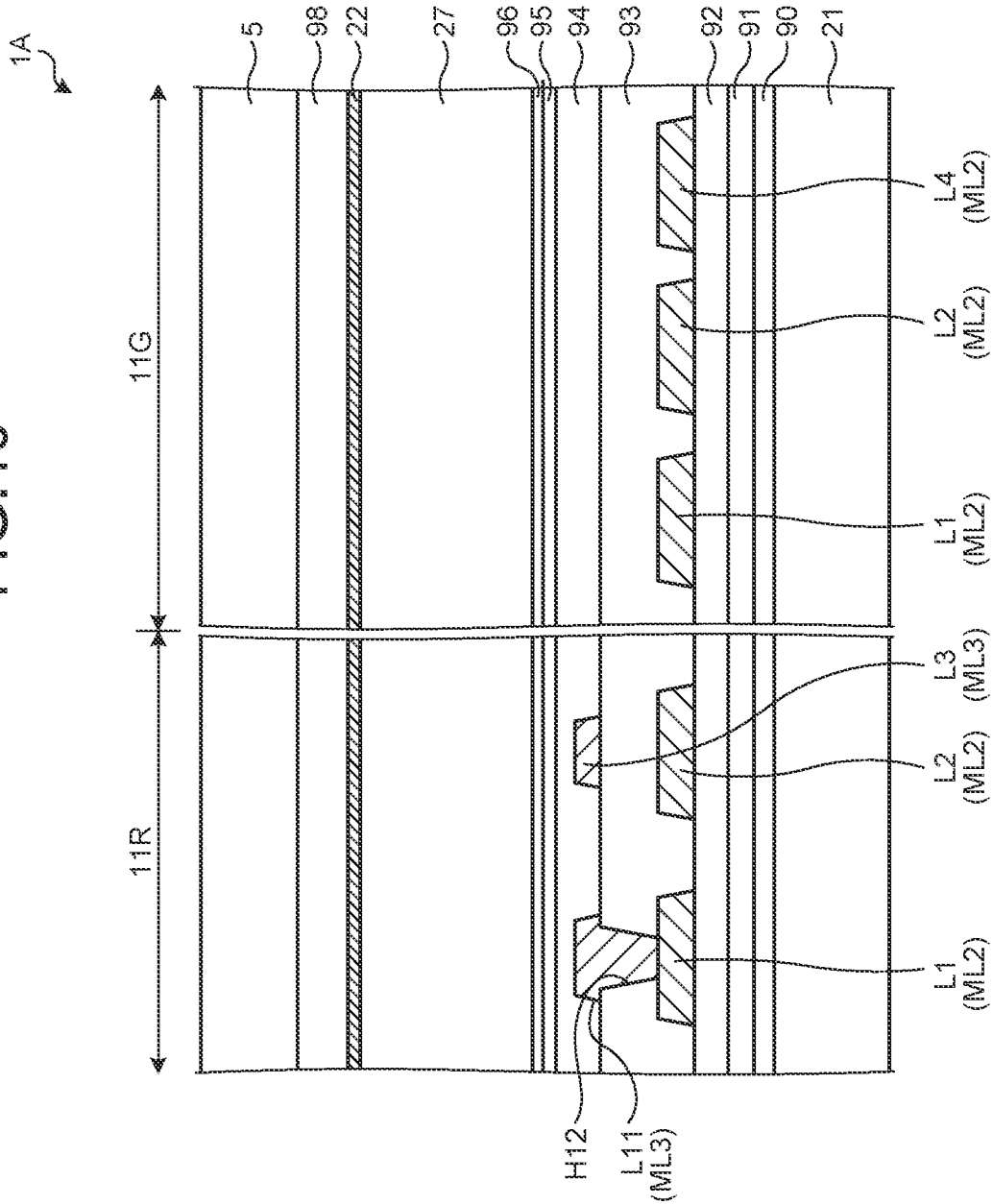
FIG. 10 is a sectional view along line X-X' of FIG. 9.

FIG. 10 is a sectional view along line X-X' of FIG. 9. In the first pixel 11R, the anode power supply line L1 and the video signal line L2 are provided on the insulating film 92 as illustrated in FIG. 10. The overlapping wiring L11 and the reset signal line L3 are provided on the insulating film 93. The overlapping wiring L11 is provided on the anode power supply line L1 and is electrically coupled to the anode power supply line L1 through a contact hole H12 formed in the insulating film 93. The reset signal line L3 is provided on the video signal line L2 and is insulated from the video signal line L2 by the insulating film 93.

The overlapping wiring L11 simply needs to be electrically coupled to the anode power supply line L1 at any desired position. In other words, the contact hole H12 may be formed in the first pixel 11R or outside the first pixel 11R, that is, in the peripheral region GA, for example.

In the second pixel 11G, the anode power supply line L1, the video signal line L2, and the initialization signal line L4 are provided in the same layer on the insulating film 92 and are disposed side by side in the first direction Dx. In other words, the anode power supply line L1, the video signal line L2, and the initialization signal line L4 in the second pixel 11G are provided in the same layer as that of the anode power supply line L1 and the video signal line L2 in the first pixel 11R.

In the display device 1A according to the second embodiment having this configuration, the reset signal line L3 serving as at least one of the signal lines is provided overlapping the video signal line L2 serving as another signal line in planar view in the first pixel 11R. With this configuration, the display device 1A can make the metal wiring occupancy of the first pixel 11R smaller than that of the second pixel 11G. The metal wiring occupancy of the first pixel 11R is approximately 67% to 83%, and specifically is approximately 75%, for example. The metal wiring occupancy of the second pixel 11G is approximately 72% to 88%, and specifically is approximately 80%, for example, similarly to the first embodiment.

With the overlapping wiring L11, the total resistance of the anode power supply line L1 and the overlapping wiring L11 is smaller than the resistance of the anode power supply line L1 provided as a single layer. With this configuration, the display device 1A can prevent the voltage of the signals supplied to the anode terminal 32 of the light emitting element 3R from dropping, thereby increasing the emission intensity of the light emitting element 3R.

The stacking order of the video signal line L2 and the reset signal line L3 according to the second embodiment may be opposite. In other words, the reset signal line L3 may be made of the second metal layer ML2 and be provided on the insulating film 92, and the video signal line L2 may be made of the third metal layer ML3 and be provided on the insulating film 93.

The parts that have been described as the anode terminal 32 and the cathode terminal 33 above are not limited to those in the present specification and may be exchanged depending on the coupling direction of the light emitting element 3 and the application direction of the voltage. While one electrode of the light emitting element 3 is disposed at a lower part, and the other electrode is disposed at an upper part in FIGS. 5 and 8, both the electrodes may be disposed at a lower part, that is, on the side facing the array substrate 2. In other words, the display device 1 does not necessarily have a face-up structure in which the upper part of the light emitting element 3 is coupled to the cathode electrode 22. The display device 1 may have what is called a face-down structure in which the lower part of the light emitting element 3 is coupled to the anode electrode 23 and the cathode electrode 22.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A display device comprising:
   a substrate;
   pixels including a first pixel and a second pixel disposed on the substrate;
   inorganic light emitting elements provided in the respective pixels;
   signal lines configured to supply a signal to the pixels, the signal lines including a first signal line and a second signal line; and
   power supply lines configured to supply a power supply potential to the pixels, the power supply lines including a first power supply line and a second power supply line, wherein
   the first signal line is provided in a layer different from a layer of the first power supply line in the first pixel,
   the second signal line and the second power supply line are provided in the same layer in the second pixel,
   the first signal line is provided overlapping the first power supply line in planar view seen from a direction perpendicular to the substrate in the first pixel and extends in a same direction in which the first power supply line extends, and
   the second signal line and the second power supply line are provided side by side in the planar view in the second pixel.

2. The display device according to claim 1, wherein a thickness of the first power supply line in the first pixel is thicker than a thickness of the second power supply line in the second pixel.

3. The display device according to claim 1, further comprising a first metal layer, a second metal layer, and a third metal layer provided in different layers in the direction perpendicular to the substrate, wherein
   the first pixel comprises a first transistor electrically coupled to the respective inorganic light emitting element, a second transistor coupled to the first transistor, and a scanning line made of the first metal layer,
a semiconductor layer of the first transistor is electrically coupled to the inorganic light emitting element via an electrode made of the second metal layer, and
a semiconductor layer of the second transistor is electrically coupled to the first signal line made of the third metal layer.

4. The display device according to claim 1, wherein sheet resistance of the power supply lines is equal to or lower than sheet resistance of the first signal line provided in the layer different from the layer of the power supply lines.

5. The display device according to claim 1, wherein
the first pixel displays red, and
the second pixel displays blue or green.

6. The display device according to claim 1, wherein
the first signal line and the second signal line are video signal lines, and
the power supply lines are anode power supply lines.

7. A display device comprising:
a substrate;
pixels including a first pixel and a second pixel disposed on the substrate;
inorganic light emitting elements provided in the respective pixels;
signal lines configured to supply a signal to the pixels, the signal lines including a first signal line and a second signal line; and
power supply lines configured to supply a power supply potential to the pixels, the power supply lines including a first power supply line and a second power supply line, wherein
the first signal line is provided in a layer different from a layer of the first power supply line in the first pixel,
the second signal line and the second power supply line are provided in the same layer in the second pixel,
the first signal line is provided overlapping the first power supply line in planar view seen from a direction perpendicular to the substrate in the first pixel and extends in a same direction in which the first power supply line extends,
the second signal line and the second power supply line are provided side by side in the planar view in the second pixel,
the signal lines further includes a third signal line,
the first signal line is provided overlapping the third signal line in planar view seen from a direction perpendicular to the substrate in the first pixel, and
the signal lines are provided side by side in the second pixel.

8. The display device according to claim 7, further comprising overlapping wiring provided overlapping the first power supply line and electrically coupled to the first power supply line in the first pixel, wherein
the overlapping wiring is provided in the same layer as a layer of the first signal line.

9. A display device comprising:
a substrate;
pixels including a first pixel and a second pixel disposed on the substrate;
inorganic light emitting elements provided in the respective pixels;
signal lines configured to supply a signal to the pixels, the signal lines including a first signal line and a second signal line; and
power supply lines configured to supply a power supply potential to the pixels, the power supply lines including a first power supply line and a second power supply line, wherein
the first signal line is provided in a layer different from a layer of the first power supply line in the first pixel,
the second signal line and the second power supply line are provided in the same layer in the second pixel,
the first signal line is provided overlapping the first power supply line in planar view seen from a direction perpendicular to the substrate in the first pixel and extends in a same direction in which the first power supply line extends,
the second signal line and the second power supply line are provided side by side in the planar view in the second pixel,
a ratio of the total area of metal wiring including the signal lines and the first power supply line to the area of the first pixel is smaller than a ratio of the total area of metal wiring including the signal lines and the second power supply line to the area of the second pixel in planar view seen from the direction perpendicular to the substrate.

10. A display device comprising:
a substrate;
pixels including a first pixel and a second pixel disposed on the substrate;
inorganic light emitting elements provided in the respective pixels;
signal lines configured to supply a signal to the pixels, the signal lines including a first signal line and a second signal line;
power supply lines configured to supply a power supply potential to the pixels, the power supply lines including a first power supply line and a second power supply line;
a circularly polarizing plate facing the substrate and provided on the inorganic light emitting elements, wherein
the first signal line is provided in a layer different from a layer of the first power supply line in the first pixel,
the second signal line and the second power supply line are provided in the same layer in the second pixel,
the first signal line is provided overlapping the first power supply line in planar view seen from a direction perpendicular to the substrate in the first pixel and extends in a same direction in which the first power supply line extends,
the second signal line and the second power supply line are provided side by side in the planar view in the second pixel, and
the circularly polarizing plate has higher transmittance for light having a wavelength of red than for light having a wavelength of blue or green.

* * * * *